US 6,668,366 B2

(12) United States Patent
Liao et al.

(10) Patent No.: US 6,668,366 B2
(45) Date of Patent: Dec. 23, 2003

(54) SYSTEM AND METHOD FOR PROCESSING A TRANSISTOR CHANNEL LAYOUT

(75) Inventors: Hongmei Liao, Tewksbury, MA (US); Scott A. Johannesmeyer, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 41 days.

(21) Appl. No.: 09/932,310

(22) Filed: Aug. 17, 2001

(65) Prior Publication Data
US 2002/0023254 A1 Feb. 21, 2002

Related U.S. Application Data
(60) Provisional application No. 60/226,369, filed on Aug. 18, 2000.

(51) Int. Cl.[7] .................................................. G06F 17/50
(52) U.S. Cl. ............................. 716/14; 716/12; 716/13
(58) Field of Search .............................. 716/14, 13, 15, 716/16, 11, 12, 2; 365/154; 257/368

(56) References Cited

U.S. PATENT DOCUMENTS

| 5,157,618 A | * | 10/1992 | Ravindra et al. .............. 716/16 |
| 5,493,509 A | * | 2/1996 | Matsumoto et al. ............ 716/2 |
| 5,526,303 A | * | 6/1996 | Okajima ...................... 365/154 |
| 5,610,832 A | * | 3/1997 | Wikle et al. ................... 716/11 |
| 5,701,255 A | * | 12/1997 | Fukui ........................... 716/12 |
| 6,005,296 A | * | 12/1999 | Chan ............................ 257/368 |

* cited by examiner

Primary Examiner—Vuthe Siek
Assistant Examiner—Binh Tat
(74) Attorney, Agent, or Firm—Peter K. McLarty; W. James Brady, III; Frederick J. Telecky, Jr.

(57) ABSTRACT

A system for processing a transistor channel layout includes a processor coupled to an input device, an output device, a memory, and a data retrieval device. The memory stores input layout data defining a transistor channel layout having a bend between a first end and a second end. The memory further stores contour adjustment data. The processor adjusts the bend of the transistor channel layout according to the contour adjustment data and generates output layout data defining the adjusted transistor channel layout.

15 Claims, 3 Drawing Sheets

BEND LENGTH (L) (μM) 38

| | 38a<br>.035<L<=.105 | 38b<br>.105<L<=.15 | 38c<br>.15<L<=.28 | 38d<br>.28<L<=.43 | 38e<br>L>.43 | |
|---|---|---|---|---|---|---|
| 68 | .15 | .180 | .130 | .125 | .140 | CORNER EDGE DATA 64 |
| 70 | .035–.105 | .120 | .130 | .125 | .140 | |
| 72 | NA | NA | .150 | .180 | .150 | |
| 74 | NA | NA | .150 | .140 | .150 | NOTCH DATA 66 |
| 76 | NA | NA | .025 | .030 | .020 | |
| 78 | NA | NA | .025 | .025 | .020 | |

60 ↙ ; CONTOUR ADJUSTMENT DATA 26

SYSTEM AND METHOD FOR PROCESSING A TRANSISTOR CHANNEL LAYOUT

This application claims priority under 35 USC §119(e)(1) of provisional application Ser. No. 60/226,369, filed Aug. 18, 2000.

TECHNICAL FIELD OF THE INVENTION

This invention relates in general to electronic devices, and more particularly to a system and method for processing a transistor channel layout.

BACKGROUND OF THE INVENTION

A photomask is generally used to establish a pattern for the fabrication of a transistor channel. The photomask is generated according to a transistor channel layout. Transistor channel layouts often include bends between a first end of the channel and a second end of the channel in order to increase the packing density of transistors on an integrated circuit board. A drawback to patterning bends in a transistor channel layout is that upon fabrication of the transistor, the length of the transistor channel may be non-uniform over the width of the channel from the first end to the second end. These non-uniformities in transistor channel dimensions degrade the transistor performance.

SUMMARY OF THE INVENTION

In accordance with the present invention, a system for processing a transistor channel layout is provided which substantially eliminates or reduces disadvantages and problems associated with previous systems.

In accordance with one embodiment of the present invention, a system for processing a transistor channel layout includes a memory and a processor. The memory stores input layout data defining a transistor channel layout having a bend between a first end and a second end. The memory further stores contour adjustment data. The processor adjusts the bend of the transistor channel layout according to the contour adjustment data and generates output layout data defining the adjusted transistor channel layout.

Another embodiment of the present invention is a method for processing a transistor channel layout, wherein the method includes receiving input layout data defining a transistor channel layout having a bend between a first end and a second end. The method continues by receiving contour adjustment data and adjusting the bend of the transistor channel layout according to the contour adjustment data. The method concludes by generating output layout data defining the adjusted transistor channel layout.

Yet another embodiment of the present invention is a transistor channel layout defined by layout data. The layout includes a bend between a first end and a second end. The bend includes an inner corner and an outer corner wherein a portion of the outer corner is removed to form a corner edge at a particular angle.

A technical advantage of the present invention is a technique for processing transistor channel layouts. An adjusted transistor channel layout of the present invention may be used to fabricate a transistor channel that meets particular dimension and/or performance parameters. For example, an advantage to fabricating a transistor channel using an adjusted transistor channel layout is that the length of the channel is uniform over the width of the transistor channel from a first end of the channel to the second end of the channel. This results in a high transistor packing density while maintaining transistor performance and speed.

Other technical advantages are readily apparent to one of skill in the art from the attached figures, description, and claims.

BRIEF DESCRIPTION OF THE DRAWINGS

For a more complete understanding of the present invention and its advantages, reference is now made to the following description taken in conjunction with the accompanying drawings, in which like reference numbers indicate like features and wherein.

DETAILED DESCRIPTION OF THE INVENTION

Figure 1:
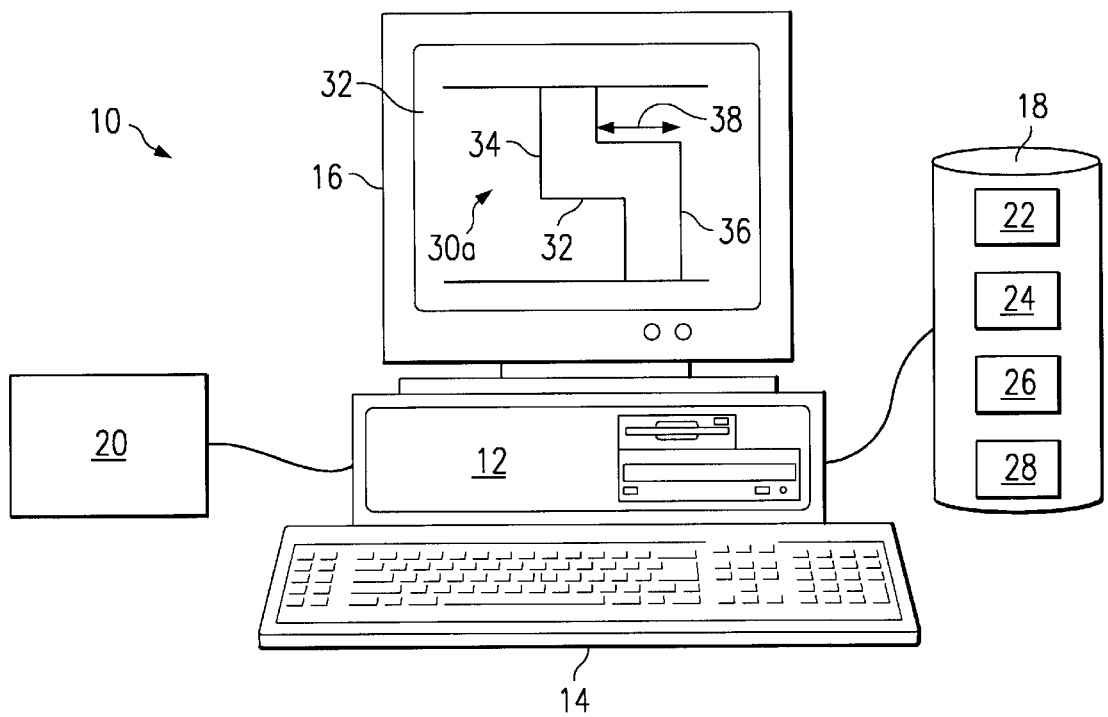
FIG. 1 illustrates a block diagram of a system for processing a transistor channel layout.

FIG. 1 illustrates a block diagram of a system 10 for processing a transistor channel layout. System 10 includes a processor 12 coupled to an input device 14, an output device 16, a memory 18, and a photomask generation tool 20. In general, processor 12 executes an application 22 to receive input layout data 24 defining an input transistor channel layout 30a, and to receive contour adjustment data 26 associated with layout 30a. Processor 12 adjusts layout 30a according to contour adjustment data 26 and generates output layout data 28 defining an adjusted transistor channel layout 30b. In this respect, transistor channel layout 30b comprises a version of transistor channel layout 30a adjusted according to contour adjustment data 26. Layouts 30a and 30b are generally referred to as transistor channel layout 30.

Processor 12 comprises a central processing unit associated with a computer system, such as a mainframe, workstation, a laptop computer, a personal digital assistant, or any other suitable general purpose data processing facility. In general, processor 12 executes application 22 with any suitable operating system environment, such as, for example, MS-DOS, PC-DOS, OS2, MAC-OS ™, UNIX™, or WINDOWS™.

Input device 14 comprises a keyboard, mouse, graphics tablet, touch screen, pressure sensitive pad, joystick, trackball, light pen, microphone, or any other suitable input device. Output device 16 comprises a cathode ray tube display, a liquid crystal display, a flat panel display, a printer, a plotter, or any other suitable output device. Output device 16 may display transistor channel layout 30 using a graphical user interface 32 ("GUI") associated with application 22. GUI 32 serves as an interactive interface between a user and application 22.

Memory 18 comprises a file, a stack, or any other suitable organization of volatile or non-volatile memory that stores application 22, input layout data 24, contour adjustment data 26, output layout data 28, and any associated files, tables, or buffers in RAM, ROM, CD-ROM, or any other form of magnetic or optical storage. Items stored in memory 18 may be retrieved using a disc drive, a CD-ROM drive, a hard drive, or any other suitable magnetic or optical data retrieval device associated with processor 12.

Photomask generation device 20 comprises any suitable tool that generates a photomask of the transistor channel layout 30b defined by output layout data 28. The photomask generated by device 20 may then be used to fabricate an appropriate transistor channel on a silicon substrate.

Application 22 comprises a software computer application having a set of instructions, procedures, and/or related data adapted for implementation in a suitable computer language such as, for example, Visual Basic, JAVA, C or C++, or any other appropriate development language. Application 22 may be a stand-alone application or delivered integral to or with other transistor channel processing applications.

Input layout data 24 comprises numerical or other information defining an input transistor channel layout 30a having one or more bends 32 between a first end 34 and a second end 36, as described in greater detail with reference to FIG. 3B. Bends 32 may be patterned in a particular layout 30 to increase the packing density of transistors on an integrated circuit board. A drawback to patterning bends 32 in a layout 30 is that upon fabrication of the transistor, the length of the transistor channel may be non-uniform over the width of the channel from the first end 34 to the second end 36, as described in greater detail with respect to FIG. 2. These non-uniformities in transistor channel dimensions degrade the transistor performance. Bend 32 of input transistor channel layout 30a comprises a particular bend length 38. Different layouts 30a may have bends 32 of varying bend lengths 38. As described in greater detail below, processor 12 may process a particular layout 30 according to the bend length 38 of the bend 32.

Contour adjustment data 26 comprises numerical or other information used to modify, adjust, or otherwise reconfigure the contour of input transistor channel layout 30a defined by input layout data 24. Contour adjustment data 26 may comprise corner edge data and notch data, as described in greater detail with reference to FIGS. 3A and 3B.

Output layout data 28 comprises numerical or other information defining transistor channel layout 30b adjusted according to contour adjustment data 26. The transistor channel layout 30b defined by data 28 is described in greater detail with reference to FIG. 5. The bend 32 of transistor channel layout 30b generally comprises the bend 32 of transistor channel layout 30a adjusted according to contour adjustment data 26.

In operation, processor 12 launches application 22 and receives input layout data 24 defining an input transistor channel layout 30a. Display 16 may display a graphical representation of transistor channel layout 30a. The transistor channel layout 30a includes one or more bends 32, each bend 32 having a particular bend length 38. In one embodiment, processor 12 receives contour adjustment data 26 from memory 18 based upon the bend length 38 of each bend 32. In another embodiment, processor 12 receives contour adjustment data 26 from a user of application 22. Processor 12 generates transistor channel layout 30b, illustrated in FIG. 4, by adjusting each bend 32 of the transistor channel layout 30a according to the appropriate contour adjustment data 26. Transistor channel layout 30b therefore comprises a version of transistor channel layout 30a adjusted according to the appropriate contour adjustment data 26. Processor 12 generates and stores output layout data 28 defining the adjusted transistor channel layout 30b.

Processor 12 models a photomask defining a simulated transistor channel according to the output layout data 28. Processor 12 determines whether the simulated transistor channel meets particular dimension and/or performance parameters of the transistor. If not, processor 12 adjusts layout 30 according to modified contour adjustment data 26. Processor 12 may execute this iterative process until a transistor channel is simulated from a layout 30b such that the transistor channel meets the appropriate dimension and/or performance parameters.

In a particular embodiment, output layout data 28 defining an adjusted layout 30b is used to process a portion of a logic cell of gate transistors formed on an integrated circuit. For example, device 20 generates a photomask of the transistor channel layout 30b defined by output layout data 28. The photomask generated by device 20 may then be used to fabricate an appropriate polysilicon transistor channel on a silicon substrate.

Figure 2:
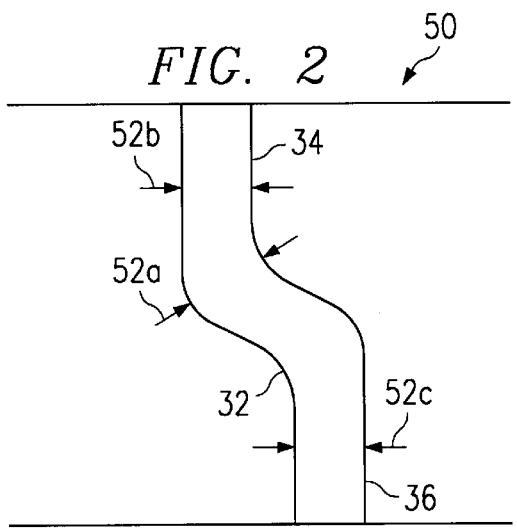
FIG. 2 illustrates a transistor channel formed using a transistor channel layout.

FIG. 2 illustrates one embodiment of a transistor channel 50 fabricated on a silicon substrate using a photomask derived from an input transistor channel layout 30a. Transistor channel 50 comprises a bend 32 between a first end 34 and a second end 36. In addition, channel 50 comprises channel lengths 52a, 52b, and 52c measured at various positions along the width of channel 50 such as, for example, at bend 32, first end 34, and second end 36, respectively. Channel lengths 52a–c are generally referred to as channel lengths 52. One drawback to fabricating a transistor channel 50 using a transistor channel layout 30a, prior to the adjustment processing techniques of the present invention, is that channel lengths 52 are non-uniform over the width of the channel 50 from first end 34 to second end 36. In particular, channel length 52a at bend 32 may be larger (e.g., 0.03–0.07 micrometers) than channel lengths 52b and 52c at ends 34 and 36, respectively. These non-uniformities in transistor channel dimensions may degrade the performance of the transistor.

Figures 3A, 3B:
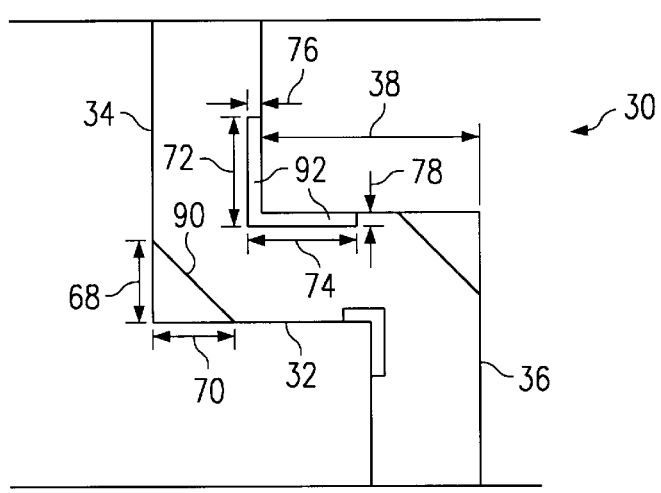
FIG. 3A illustrates a table of contour adjustment data used to adjust the transistor channel layout.
FIG. 3B illustrates contour adjustments to the transistor channel layout according to the contour adjustment data.

FIG. 3A illustrates one embodiment of a table 60 used to associate bend length 38 of bends 32 with contour adjustment data 26. In particular, for various ranges of bend length 38, such as the ranges defined by bend lengths 38a–e, table 60 associates the appropriate contour adjustment data 26, such as corner edge data 64 and notch data 66. Corner edge data 64 comprises a corner end length 68 and a corner bend length 70. Notch data 66 comprises a notch end length 72, a notch bend length 74, a notch end depth 76, and a notch bend depth 78.

In one embodiment, contour adjustment data 26 identified in table 60 is optimized through successive adjustments of a transistor channel layout 30 having bends 32 of various lengths 38. For example, given a particular layout 30a having a bend 32 with a particular length 38, processor 12 adjusts layout 30a using particular contour adjustment data 26 and generates the output layout data 28 that defines the adjusted layout 30b. Processor 12 then models a photomask defining a simulated transistor channel according to the output layout data 28. Processor 12 measures various dimensions (e.g., lengths 52) and/or performance parameters (e.g., clock speed) associated with the simulated transistor channel. If the measured dimensions and/or performance characteristics do not meet particular transistor parameters, then processor 12 again adjusts layout 30 using modified contour adjustment data 26. Processor 12 repeats this process of adjusting layouts 30 and simulating transistor channels using output layout data 28 until the simulated transistor channel meets the appropriate transistor parameters. In a particular embodiment, a user of application 22 manually adjusts a layout 30 through successive iterations until the simulated transistor channel meets the appropriate transistor parameters.

The contour adjustment data 26 used to simulate the transistor channel that achieves the transistor parameters are then captured and categorized in table 60 according to the bend length 38 of the bend 32 in the original input layout 30a. By repeating this optimization of contour adjustment data 26 for bends 32 of varying bend lengths 38, a table 60 of data 26 is generated. When processor 12 encounters a layout 30 having a bend 32 with a particular bend length 38, processor 12 retrieves the appropriate contour adjustment data 26 from table 60 to generate an adjusted layout 30b and the appropriate output layout data 28. In this respect, contour adjustment data 26 identified in table 60 represents data that may be collected through iterative modeling and optimization techniques.

FIG. 3B illustrates adjustments made to a layout 30 using contour adjustment data 26. For example, corner end length 68 and corner bend length 70 define a portion of layout 30 that is removed to form a corner edge 90. By varying lengths 68 and 70, the angle of corner edge 90 may be adjusted an appropriate amount. Notch end length 72, notch bend length 74, notch end depth 76, and notch bend depth 78 define a portion of layout 30 that is removed to form a notch 92.

Figure 4:
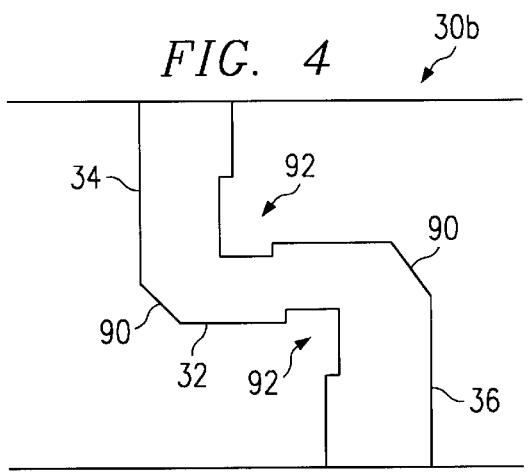
FIG. 4 illustrates an adjusted transistor channel layout.

The particular values for contour adjustment data 26 used to form corner edge 90 and notch 92 are determined according to bend length 38 as defined by the associations illustrated in table 60 of FIG. 3A. By strategically removing portions of layout 30 using contour adjustment data 26, a particular input transistor channel layout 30a may be adjusted to form an adjusted transistor channel layout 30b, as illustrated in FIG. 4. The adjusted transistor channel layout 30b may then be used to fabricate a transistor channel that meets particular dimension and/or performance parameters, as described in greater detail with reference to FIG. 5.

FIG. 4 illustrates a transistor channel layout 30b adjusted by processor 12 according to the appropriate contour adjustment data 26. Bend 32 of layout 30b includes inner corners and outer corners. In one embodiment, a portion of the outer corners is removed to form corner edges 90. By strategically varying the corner end length 68 and the corner bend length 70, the corner edge 90 may be formed at a particular angle.

In another embodiment, a portion of the inner corners is removed to form notches 92. By strategically varying notch end length 72, notch bend length 74, notch end depth 76, and/or notch bend depth 78, notches 92 may be specifically formed to have a particular size, shape, and/or dimension. In a particular embodiment, notch 92 is asymmetrically formed by providing different values for notch end length 72 and notch bend length 74 and/or notch end depth 76 and notch bend depth 78.

Figure 5:
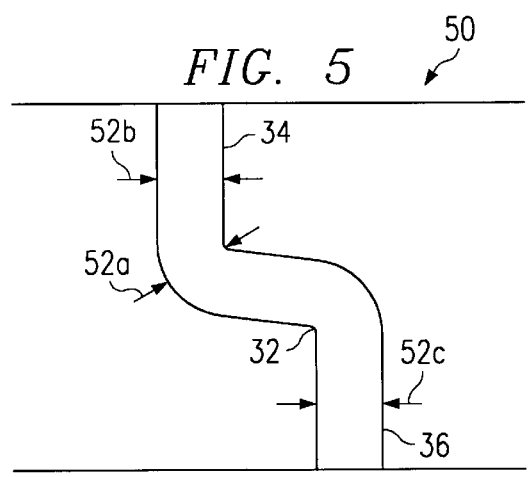
FIG. 5 illustrates a transistor channel formed using the adjusted transistor channel layout.

FIG. 5 illustrates one embodiment of a transistor channel 50 fabricated on a silicon substrate using a photomask derived from the transistor channel layout 30b illustrated in FIG. 4. Transistor channel 50 comprises a bend 32 between a first end 34 and a second end 36. In addition, channel 50 comprises channel lengths 52a–c measured at various positions along the width of channel 50. One advantage to fabricating a transistor channel 50 using an adjusted transistor channel layout 30b is that channel length 52 is uniform over the width of the channel from first end 32 to second end 34. In particular, channel length 52a is substantially the same as channel length 52b and channel length 52c. This results in a high transistor packing density while maintaining transistor performance and speed.

Figure 6:
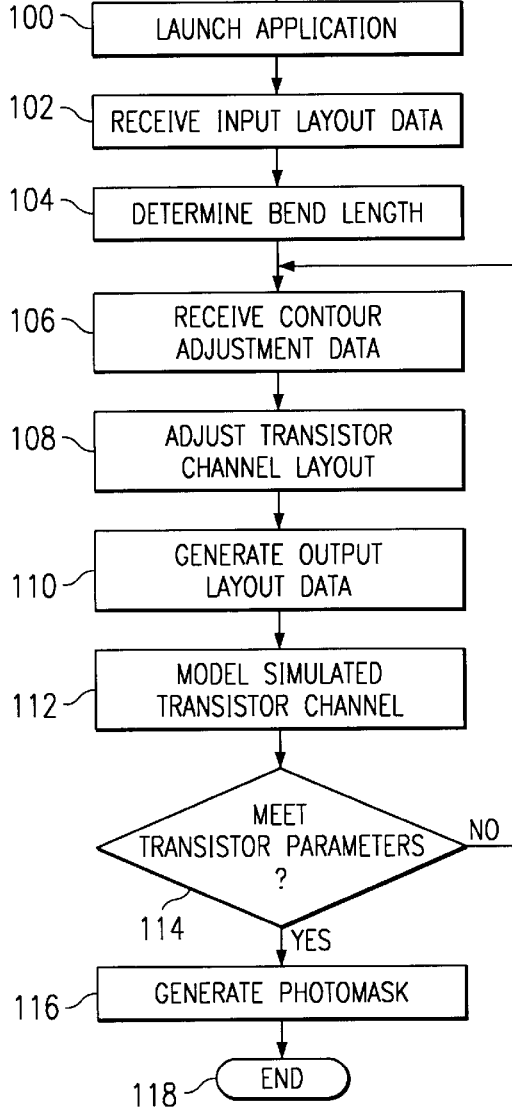
FIG. 6 illustrates a flowchart of a method for processing a transistor channel layout.

FIG. 6 is a flow chart of an exemplary method for processing a transistor channel layout 30. The method begins at step 100 where processor 12 launches application 22. Processor 12 receives input layout data 24 defining an input transistor channel layout 30a, at step 102. Layout 30a comprises one or more bends 32 between a first end 34 and a second end 36. Processor 12 determines the bend length 38 of each bend 32, at step 104. For each bend 32 of a layout 30a, processor 12 receives contour adjustment data 26 at step 106. In one embodiment, processor 12 retrieves contour adjustment data 26 from table 60 stored in memory 18, according to the appropriate bend length 38 determined at step 104. In this embodiment, contour adjustment data 26 has been determined to provide an adjusted output layout 30b that yields a transistor channel 50 which meets the appropriate dimension and/or performance parameters of the transistor, as described above with respect to FIG. 3A.

In another embodiment, processor 12 receives contour adjustment data 26 from a user of application 22. In this embodiment, processor 12 adjusts layout 30 in response to user input through successive iterations until the simulated transistor channel meets the appropriate dimension and/or performance parameters, as described in greater detail with reference to steps 108–112. Processor 12 adjusts transistor channel layout 30 according to the contour adjustment data 26 received at step 106, at step 108. In particular, processor 12 may form corner edges 90 and/or notches 92 in bends 32 of a particular layout 30 using corner edge data 64 and/or notch data 66. Processor 12 generates output layout data 28 defining the adjusted transistor channel layout 30b generated at step 108, at step 110. Execution proceeds to step 112 where processor 12 models a photomask defining a simulated transistor channel according to the output layout data 28 generated at step 110.

Processor 12 determines whether the simulated transistor channel modeled at step 112 meets appropriate dimension and/or performance parameters associated with the transistor, at step 114. For example, processor 12 determines whether the length 52 of the simulated transistor channel meets particular dimension parameters. In another example, processor 12 determines whether the clock speed of the simulated transistor meets particular performance parameters. If not, execution returns to step 106 where processor 12 receives modified contour adjustment data 26. If so, execution proceeds to step 116 where device 20 generates a photomask based on the output layout data 28 generated at step 110. The photomask generated by device 20 at step 116 may then be used to fabricate an appropriate transistor channel on a silicon substrate. Execution terminates at step 118.

Although the present invention has been described with several embodiments, a myriad of changes, variations, alterations, transformations and modifications may be suggested to one skilled in the art, and it is intended that the present invention encompasses such changes, variations, alterations, transformations, and modifications as fall within the spirit and scope of the appended claims.

What is claimed is:

1. A system for processing a transistor channel layout, comprising:
    a memory operable to store:
        input layout data defining a transistor channel layout having a bend between a first end and a second end; and
        contour adjustment data; and
    a processor coupled to the memory and operable to:
        adjust the bend of the transistor channel layout according to the contour adjustment data; and
        generate output layout data defining the adjusted transistor channel layout.

2. The system of claim 1, wherein the bend of the transistor channel layout comprises a bend length.

3. The system of claim 2, wherein the contour adjustment data comprise first corner length data and second corner length data selected based upon the bend length.

4. The system of claim 3, wherein the processor is operable to adjust the bend of the transistor channel layout according to the first corner length data and the second corner length data.

5. The system of claim 2, wherein the contour adjustment data comprise notch length data and notch depth data selected based upon the bend length.

6. The system of claim 5, wherein the processor is operable to adjust the bend of the transistor channel layout according to the notch length data and the notch depth data.

7. The system of claim 1, wherein the processor is further operable to model a photomask defining a simulated transistor channel according to the output layout data, wherein the length of the simulated transistor channel at the bend is substantially equal to the length of the simulated transistor channel at the first end and the length of the simulated transistor channel at the second end.

8. A method for processing a transistor channel layout, comprising:
    receiving input layout data defining a transistor channel layout having a bend between a first end and a second end;
    receiving contour adjustment data;
    adjusting the bend of the transistor channel layout according to the contour adjustment data; and
    generating output layout data defining the adjusted transistor channel layout.

9. The method of claim 8, further comprising receiving a bend length associated with the bend of the transistor channel layout.

10. The method of claim 9, further comprising selecting particular contour adjustment data based upon the bend length.

11. The method of claim 10, wherein the particular contour adjustment data comprise first corner length data and second corner length data.

12. The method of claim 11, further comprising adjusting the bend of the transistor channel layout according to the first corner length data and the second corner length data.

13. The method of claim 10, wherein the particular contour adjustment data comprise notch length data and notch depth data.

14. The method of claim 13, further comprising adjusting the bend of the transistor channel layout according to the notch length data and the notch depth data.

15. The method of claim 8, further comprising modeling a photomask according to the output layout data, the photomask defining a simulated transistor channel having a bend between a first end and a second end, wherein the length of the simulated transistor channel at the bend is substantially equal to the length of the simulated transistor channel at the first end and the length of the simulated transistor channel at the second end.

* * * * *